United States Patent
Obikane

(10) Patent No.: US 6,830,651 B2
(45) Date of Patent: Dec. 14, 2004

(54) LOAD PORT CAPABLE OF COPING WITH DIFFERENT TYPES OF CASSETTE CONTAINING SUBSTRATES TO BE PROCESSED

(75) Inventor: Tadashi Obikane, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 89 days.

(21) Appl. No.: 10/259,612

(22) Filed: Sep. 30, 2002

(65) Prior Publication Data

US 2004/0040661 A1 Mar. 4, 2004

(30) Foreign Application Priority Data

Aug. 29, 2002 (JP) ........................................ 2002-250020

(51) Int. Cl.[7] .......................... C23F 1/00; C23C 16/00; B65G 49/07
(52) U.S. Cl. ........................... 156/345.31; 156/345.32; 118/719; 414/935; 414/937; 414/940; 414/217.1; 414/222.02; 414/222.04
(58) Field of Search ....................... 156/345.31, 345.32; 118/719; 414/222.01, 222.02, 222.04, 939–940, 217.01

(56) References Cited

U.S. PATENT DOCUMENTS

| | | | | |
|---|---|---|---|---|
| 5,655,869 A | * | 8/1997 | Scheler et al. | 414/222.01 |
| 5,674,039 A | * | 10/1997 | Walker et al. | 414/222.05 |
| 5,713,711 A | * | 2/1998 | McKenna et al. | 414/217.1 |
| 5,788,458 A | * | 8/1998 | Bonora et al. | 414/811 |
| 5,895,161 A | * | 4/1999 | Winkler et al. | 401/75 |
| 6,082,949 A | * | 7/2000 | Rosenquist | 414/217 |
| 6,135,698 A | * | 10/2000 | Bonora et al. | 414/416.01 |
| 6,220,808 B1 | * | 4/2001 | Bonora et al. | 414/217 |
| 6,298,280 B1 | * | 10/2001 | Bonora et al. | 700/218 |
| 6,409,448 B1 | * | 6/2002 | Sindledecker | 414/222.04 |
| 6,501,070 B1 | * | 12/2002 | Bacchi et al. | 250/239 |
| 6,612,797 B1 | * | 9/2003 | Bonora et al. | 414/217 |
| 6,632,068 B2 | * | 10/2003 | Zinger et al. | 414/800 |

FOREIGN PATENT DOCUMENTS

| | | | | |
|---|---|---|---|---|
| JP | 11-67863 | | 3/1999 | |
| JP | 2000-77490 | | 3/2000 | |
| JP | 2000-164676 | | 6/2000 | |
| JP | 2002110760 A | * | 4/2002 | ........... H01L/21/68 |

* cited by examiner

Primary Examiner—Parviz Hassanzadeh
Assistant Examiner—Karla Moore
(74) Attorney, Agent, or Firm—Oblon, Spivak, McClelland, Maier & Neustadt, P.C.

(57) ABSTRACT

A load port which can selectively receive plural types of cassette having substrate which are to be processed accommodated therein is disclosed. The load port has the following constituents. That is, the load port includes a main body, an opening portion (which has a configuration that opens in the three surfaces) formed in one side surface of the main body, a placement table formed in the opening portion and used to place the cassette thereon, a first sensor mechanism (which identifies the type of the cassette) provided on the placement table, plural types of clamp mechanism (each type of the clamp mechanism clamping the corresponding type of cassette) provided on the placement table, and an up-down-type cover mechanism (which is vertically moved) which covers the opening portion of the main body.

4 Claims, 3 Drawing Sheets

LOAD PORT CAPABLE OF COPING WITH DIFFERENT TYPES OF CASSETTE CONTAINING SUBSTRATES TO BE PROCESSED

CROSS-REFERENCE TO RELATED APPLICATIONS

This application is based upon and claims the benefit of priority from the prior Japanese Patent Application No. 2002-250020, filed Aug. 29, 2002, the entire contents of which are incorporated herein by reference.

BACKGROUND OF THE INVENTION

1. Field of the Invention

This invention relates to a load port used to receive a cassette having at least one substrate to be processed such as a wafer accommodated therein, remove the substrate to be processed from the cassette and transfer the same to a preset processing apparatus.

2. Description of the Related Art

A load port of the present invention is used to handle not only semiconductor wafers but also different types of substrate to be processed such as liquid crystal display glass substrates and photomask glass substrates. Further, as a processing apparatus to which the substrate to be processed is transferred, various processing apparatuses such as a manufacturing apparatus, visual inspection apparatus, electrical characteristic test apparatus are provided. However, in order to clearly and concretely explain the prior art associated with the present invention, a wafer used in a semiconductor manufacturing process is used as the substrate to be processed and a process in a probe apparatus, that is, an electrical characteristic test process for semiconductor elements formed on the wafer is explained as the wafer processing process in the following description.

Recently, in order to enhance the manufacturing yield in a semiconductor manufacturing process, the diameter of wafers has increased and wafers with a diameter of 300 mm are used in addition to conventional wafers with a diameter of 200 mm. Plural types of cassette are provided to receive substrates such as wafers. As some of the types of the cassette, cassettes for wafers with a diameter of 200 mm and cassettes for wafers with a diameter of 300 mm are provided. Further, as cassettes with different capacities, a small cassette capable of accommodating 13 wafers and a large cassette capable of accommodating 25 wafers are provided. As the shape of the cassette, an open-type cassette in which the eject port used to remove a wafer from the cassette is open and an integral-type cassette in which the eject port is covered with an open/close door are provided.

In the conventional load port, two type of device including a dedicated device capable of accommodating an integral-type cassette and an adaptable device capable of receiving only an open-type cassette are provided. It is difficult for the open-type cassette adaptable device to receive an integral-type cassette. Further, in order to use an open-type cassette in the dedicated device for the integral-type cassette, it is necessary to use a conversion kit. Therefore, when plural types of cassette are selectively used by use of one load port, troublesome operations for the operator such as management of the conversion kit, replacement of the conversion kit are required.

In Jpn. Pat. Appln. KOKAI Publication No. 2000-77490, a load port which can treat various types of cassette is described, but it is necessary to replace the cassette fixing table in the load port, and adjustment by the operator is required even when a common fixing table is used.

The height of a wafer received in the cassette is detected by use of a sensor prior to the next step of removing the wafer from the cassette after the cassette is loaded in the load port. At this time, it is necessary to adjust the sensor position according to the wafer size, but since adjustment is performed manually, intervention by the operator is required.

BRIEF SUMMARY OF THE INVENTION

The present invention has been made in view of the above-described conventional technique.

An object based on one aspect of the present invention is to permit plural types of cassette to be received therein without using a conversion kit.

An object based on another aspect of the present invention is to automatically identify a cassette and permit automatic adjustment of a wafer position detecting sensor to be made based on the result of identification.

An object based on still another aspect of the present invention is to receive plural types of cassette completely automatically.

An object based on another aspect of the present invention is to smoothly open or close the cover which covers the load port.

As described above, the object of the present invention is to provide a load port which attains at least one of the above-described objects.

According to one aspect of the present invention, a load port which can selectively receive plural types of cassette having substrates to be processed accommodated therein and which has the following constituents is provided.

That is, the load port includes a main body, an opening portion (which has a configuration that opens in the three surfaces comprising the front and right and left side surfaces) formed in one side surface of the main body, a placement table formed in the opening portion and used to place the cassette thereon, a first sensor mechanism (which identifies the type of cassette placed on the placement table) provided on the placement table, plural types of clamp mechanism (each type of clamp mechanism clamps the cassette of the identified type according to the result of identification by the first sensor) provided on the placement table, and an up-down-type cover mechanism (which is vertically moved to open/close the three surfaces of the opening portion) which covers the opening portion of the main body.

According to another aspect of the present invention, a load port which can selectively receive plural types of cassette having substrates to be processed accommodated therein and which has the following constituents is provided.

That is, the load port includes a main body, an opening portion formed in one side surface of the main body, a placement table provided in the opening portion and used to place a cassette thereon, a first sensor mechanism (which identifies the type of cassette placed on the placement table) provided on the placement table, and plural types of clamp mechanism (each type of clamp mechanism clamps the cassette of the identified type according to the result of identification by the first sensor) provided on the placement table.

According to still another aspect of the present invention, a load port which can selectively receive plural types of cassette having substrates to be processed accommodated therein and which has the following constituents is provided.

That is, the load port includes a main body, an opening portion (which has a configuration that opens in the three surfaces comprising the front and right and left side surfaces) formed in one side surface of the main body, a placement table formed in the opening portion and used to place a cassette thereon, a clamp mechanism which holds the cassette placed on the placement table, and an up-down-type cover mechanism (which is vertically moved to open/close the three surfaces of the opening portion) which covers the opening portion of the main body.

The load port based on the various aspects of the present invention can include any one of preferable configurations or any combination thereof as follows.

The up-down-type cover mechanism includes a weight counterbalance mechanism which makes the up-down movement of the cover easy.

The up-down-type cover mechanism includes a damper which stops the cover at a desired position in the up-down movement process.

The first sensor mechanism includes a sensor which detects a cassette for substrates to be processed having a diameter of 200 mm and a sensor which detects a cassette for substrates to be processed having a diameter of 300 mm.

The types of the cassette include at least an open-type in which the eject port, through which a substrate to be processed is removed from the cassette, is open and an integral-type in which the eject port is covered with an open/close-type door.

The placement table includes a first information pad which detects whether the cassette is a small cassette in which the number of substrates to be processed accommodated therein is small or a large cassette in which the number of substrates to be processed accommodated therein is large.

The placement table includes a second information pad which detects whether the cassette is an open-type cassette or an integral-type cassette.

The first sensor mechanism outputs cassette identification information and the clamp mechanism includes a first control mechanism which automatically holds the cassette of the identified type and releases the holding operation based on the cassette identification information.

The load port includes a second sensor mechanism which detects the height of the position of a wafer in the cassette.

The second sensor mechanism includes two arm portions having sensors which detect the height of the position of a wafer in the cassette and a second control mechanism which adjusts the distance between the arm portions. The second control mechanism adjusts the distance between the arm portions so as to cope with the type of cassette based on the cassette type identification information from the first sensor mechanism.

The placement table includes a kinematic pin which positions the cassette.

The placement table includes a third sensor which detects the presence/absence of a cassette.

The load port includes a display mechanism which displays the state of the apparatus and an output signal from at least one of the first, second and third sensor mechanisms.

The load port is used in at least one of a probe apparatus which tests the electrical characteristic of an integrated circuit formed on the semiconductor wafer, a semiconductor manufacturing apparatus which manufactures semiconductors or semiconductor devices, and a semiconductor wafer observation apparatus which measures defects in wafers and electrical characteristics and the like.

According to the embodiments of this invention, plural types of cassette can be selectively received without using a conversion kit. The cassette is automatically identified and the wafer position searching sensor can be automatically adjusted based on the result of identification. Further, plural types of cassette can be selectively and completely automatically received. The cover for the load port in the embodiments of the present invention makes it possible to attain smooth opening/closing and the area occupied by the cover can be reduced.

DETAILED DESCRIPTION OF THE INVENTION

As described before, the above load port can be used to handle not only semiconductor wafers but also various types of substrate to be processed such as liquid crystal display glass substrates and photomask glass substrates. Further, in order to process the substrates to be processed, the load port can be used in various apparatuses such as an observation apparatus which checks for defects of the substrate to be processed, an apparatus which forms an integrated circuit, liquid crystal display device or electrical interconnections on a semiconductor wafer or liquid crystal display glass substrate, or an apparatus which checks the electrical characteristic of an integrated circuit, liquid crystal display device and the like.

However, in order to clearly and concretely explain the present invention, a wafer used in a semiconductor manufacturing process is used as the substrate to be processed and a process in a probe apparatus, that is, a checking process of the electrical characteristics of semiconductor elements formed on the wafer, is explained as the wafer processing in the following description.

Therefore, the present invention is not limited to a wafer as the substrate to be processed and copes with various types of substrate, and the process is not limited to a checking process and includes various processes such as surface processing.

Figure 1:
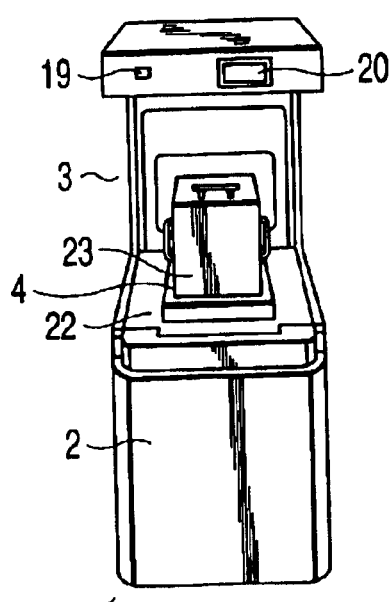
FIG. 1 is a schematic front perspective view of a load port according to one embodiment of the present invention.
Figure 2:
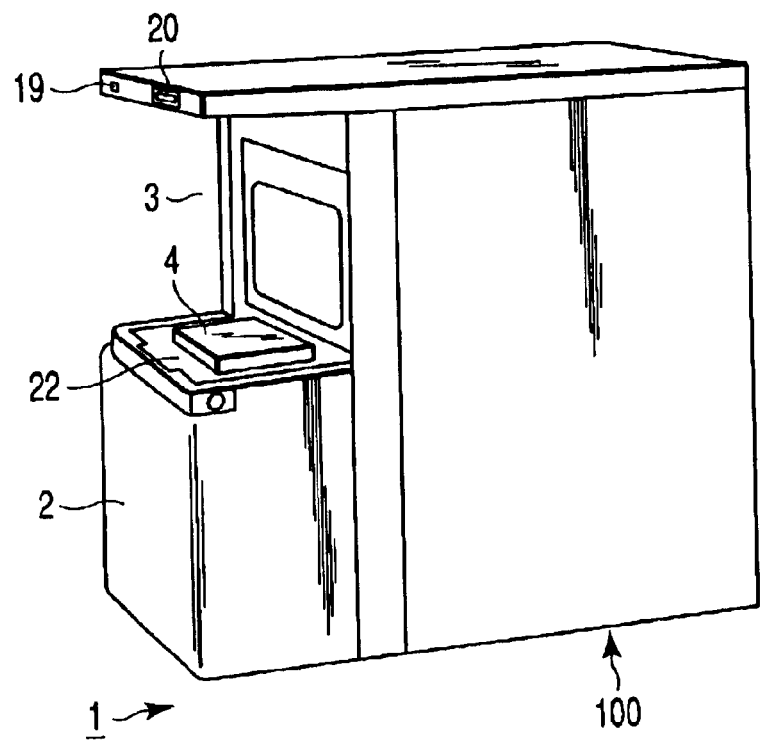
FIG. 2 is a schematic side perspective view of the load port according to the embodiment of the present invention.

There will now be described embodiments of the present invention with reference to the accompanying drawings. FIG. 1 is a schematic view showing a first embodiment of the present invention and is a front perspective view of a load port. FIG. 2 is a side perspective view of the load port. In the present embodiment, an opening portion 3 can be formed in one side surface and both side surfaces of the main body 2 of the load port. On the bottom surface of the opening portion 3, a placement table 4 used to place a cassette 23 thereon can be provided. A bottom surface area 22 is a space which makes it easy to transfer a cassette by use of a manual transfer unit (personal guided vehicle, PGV) and place the cassette in the bottom surface area. The space makes it easy to carry out the cassette. The arrangement of the placement table 4 is not limited to the above case and the placement table can be installed on an exterior side of the main body 2 instead of inside the opening portion 3.

Figure 5:
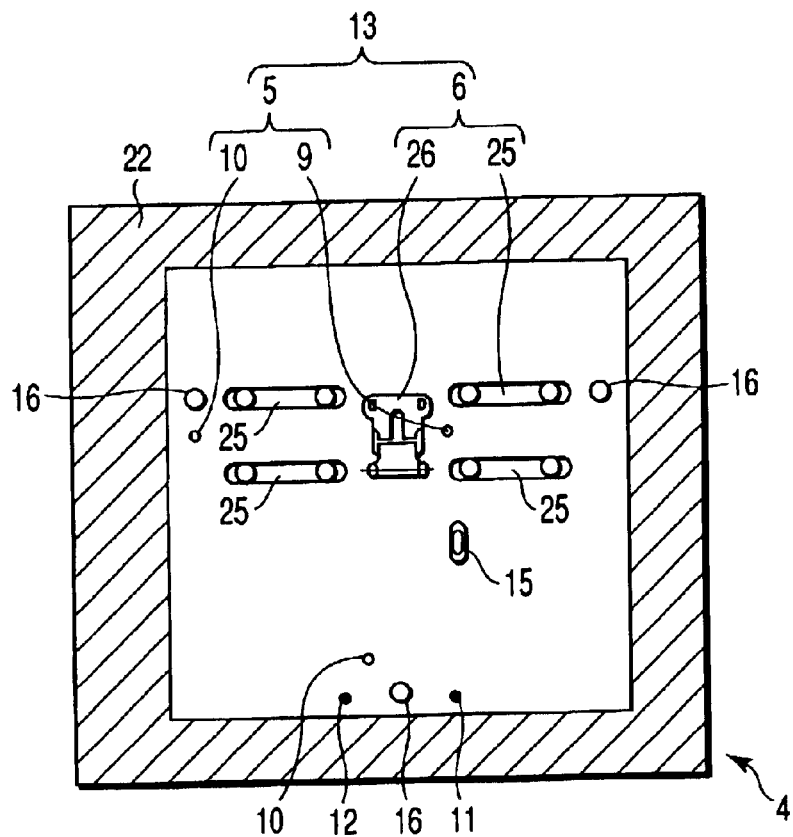
FIG. 5 is a schematic plan view of a placement table in one embodiment of the present invention.

FIG. 5 is a schematic plan view showing an example of the placement table 4 provided in the bottom surface area 22. On the placement table 4, a first sensor mechanism 5 used to identify the type of wafer cassette 23 placed on the placement table 4 can be provided. As the types of wafer cassette 23, for example, a cassette for wafers with a diameter of 200 mm and a cassette for wafers with a diameter of 300 mm are provided according to the size of the wafer to be accommodated. The first sensor mechanism 5 can be configured by a sensor 9 which detects a cassette for wafers with a diameter of 200 mm and a sensor 10 which detects a cassette for wafers with a diameter of 300 mm. As the sensors, for example, optical sensors can be used.

Further, as the wafer cassettes 23, a small cassette capable of accommodating up to 13 wafers and a large cassette capable of accommodating up to 25 wafers are provided. On the placement table 4, a first information pad 11 which detects the size of a cassette can be provided. Also, the first information pad 11 can use an optical sensor, for example.

Further, as the type of wafer cassette 23, an open type in which the ejection port used to remove a wafer 24 is open and an integral type in which the ejection port is covered with an open/close door are provided. On the placement table 4, a second information pad 12 which detects whether the wafer cassette is of an open type or an integral type can be provided. The second information pad 12 can use an optical sensor which recognizes the presence/absence of a preset configuration formed on the bottom surface of each type of wafer cassette, for example.

Further, a clamp mechanism 6 used to fix the cassette can be provided on the placement table 4. The clamp mechanism 6 can be configured by a clamp 25 which fixes a cassette for wafers with a diameter of 200 mm and a clamp 26 which fixes a cassette for wafers with a diameter of 300 mm. The number of clamps 25 and 26 can be set to one or more. In addition, a first control mechanism 13 which controls the clamp mechanism 6 can be provided on the placement table 4. The first control mechanism 13 automatically holds a wafer cassette of an identified type and releases the holding operation based on wafer cassette identification information detected by the first sensor mechanism 5.

As to the cassette for wafers with a diameter of 300 mm, the shape and pins used to fix the cassette are determined in terms of the semiconductor international standard (SEMI standard). Pins used to fix the cassette are provided on the placement table 4 as kinematic pins 16 and can be used to determine the position of the cassette for wafers with a diameter of 300 mm. At present, the kinematic pins 16 are used for cassettes for wafers with a diameter of 300 mm, but if a new cassette standard is defined in the future, it is possible to place the kinematic pins and apply the same to new cassettes.

Further, the placement table 4 can be provided with a third sensor 15 which detects the presence/absence of a cassette. By use of the third sensor 15, it is possible to prevent the load port and wafer removal device from being erroneously operated.

Figure 7:
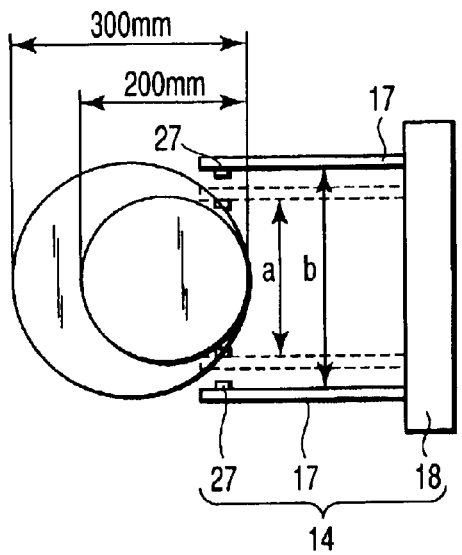
FIG. 7 is a schematic view of a mapping sensor in one embodiment of the present invention.

The load port performs the operation for removing a wafer from the cassette placed on the placement table. In order to automatically perform the above operation, it is necessary to detect the position in which the wafer is accommodated inside the cassette by use of the sensor. In the embodiment of the present invention, a second sensor mechanism 14 can be provided. As shown in FIG. 7, the second sensor mechanism includes two arm portions 17 having sensors to detect the height position of a wafer in the wafer cassette and a second control mechanism 18 which adjusts the distance between the arm portions. The two arm portions 17 can be vertically moved and both arm portions can be horizontally moved into an open/closed state. The second control mechanism 18 adjusts the distance between the arm portions to a preset width corresponding to the type of wafer cassette based on the wafer cassette type identification information output from the first sensor mechanism 5.

The load port can be provided with a cover so that foreign matter in the air can be prevented from being introduced therein when the operation for removing the wafer from the cassette is performed. It is considered providing a cover for the load port for the open-type cassette. However, in the load port for the integral-type cassette in which the wafer eject port is covered with the open/close door, it is not always necessary to provide a cover since the cassette itself is provided with a cover. Further, since the conventional cover has a configuration to cover the whole portion of the load port, the area of the cover is large. Since the load port becomes larger as the wafer becomes larger, the area occupied by the cover becomes a problem. Further, since the operation for opening/closing the cover is a swing operation using one end of the cover opening portion as the base axis, opening/closing becomes unstable.

Figure 3:
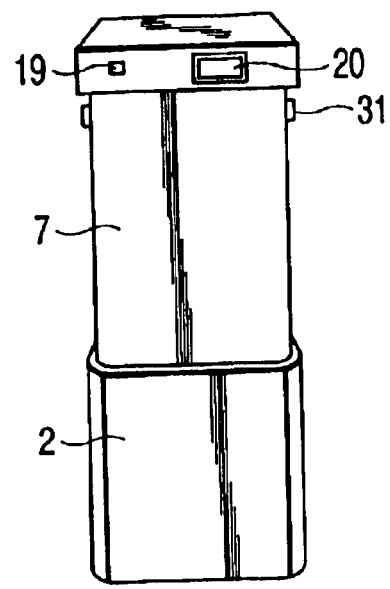
FIG. 3 is a schematic front perspective view of the load port in which its cover is closed.
Figure 4:
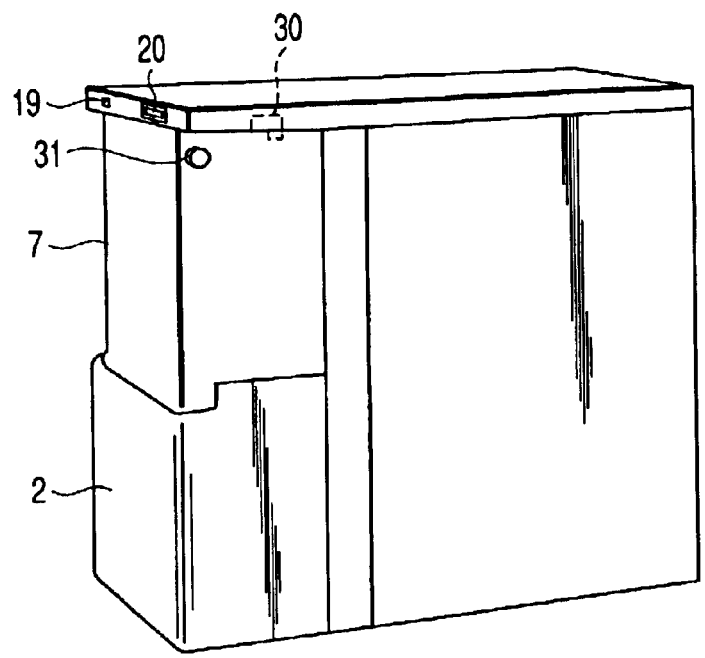
FIG. 4 is a schematic side perspective view of the load port in which its cover is closed.

FIG. 3 is a front perspective view of the load port in which the opening portion is closed with the cover in the first embodiment of the present invention and FIG. 4 is a side perspective view of the schematic view of FIG. 3. In the first embodiment of the present invention, an up-down-type cover mechanism 7 can be provided on the opening portion 3 of the main body. Thus, the opening portion of the main body can be smoothly opened/closed and the problem of unstable cover opening/closing can be solved. Further, since the up-down-type cover mechanism moves vertically to open/close only the opening portion of the main body, the area of the cover for the whole portion of the load port apparatus can be significantly reduced. The cover of the present embodiment is formed of resin, but it can be formed of another suitable material.

Figure 6:
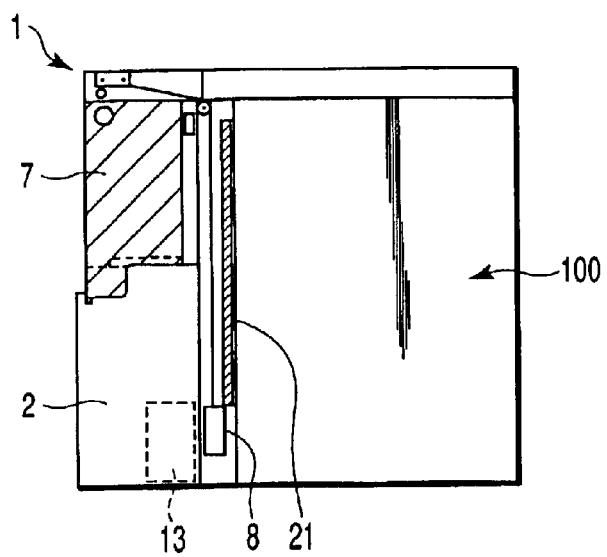
FIG. 6 is a schematic view of a cover mechanism in one embodiment of the present invention.

The up-down-type cover mechanism 7 can be provided with a weight counterbalance mechanism 8. FIG. 6 is a schematic view of the weight counterbalance mechanism 8 as viewed from the side surface of the load port. The weight counterbalance mechanism 8 makes the up-down movement of the cover easy by attaining a balance between the weight of the cover and the weight of the counterweight. Further, the up-down-type cover mechanism 7 can be provided with a damper 21. The cover can thus be stopped at a desired position in the upward or downward movement. As shown in FIG. 6, the damper 21 can be provided on the counterweight side, but it is also possible to provide the damper 21 on the cover side.

The main body 2 can be provided with a display mechanism 20 which displays the state of the apparatus and an output signal from at least one of the first, second and third sensor mechanisms. The operator can confirm the result of detection by each of the sensors by observing information displayed on the display mechanism 20.

The load port 1 can be further provided with a lock mechanism 30 to lock the cover. Locking and unlocking of the cover can be performed manually, but the locking of the cover can be performed automatically. In the first embodiment of the present invention, it is possible to automatically lock the cover when the cover is closed and release the locked state by manual operation of an unlock button 19 when the cover is to be opened. The unlock button 19 used to release the locked state can be provided on a desired portion of the main body 2 or it can be provided on the cover 7.

Next, the operation of the load port of the present invention is explained. First, a cassette is placed on the placement table 4 automatically or by use of a manual transfer unit (PGV). In the case of a cassette for wafers with a diameter of 300 mm, the alignment process is performed by use of the kinematic pins 16. Also, in the case of a cassette for wafers with a diameter of 200 mm, the alignment process can be performed by use of a means similar to the kinematic pins 16. Whether the cassette is placed or not can be confirmed by means of at least one of the third sensor 15, sensor 9 and sensor 10. After the cassette is placed in the preset position, the cover can be manually closed by use of a handle 31 provided on the cover 7 and the load port operated. If the sensor 9 configuring the first sensor mechanism 5 is set in the ON state, the sensor mechanism 5 detects that the loaded cassette is a cassette for wafers with a diameter of 200 mm. Further, if the sensor 10 configuring the first sensor mechanism 5 is set in the ON state, it indicates that the loaded cassette is a cassette for wafers with a diameter of 300 mm.

The first control mechanism 13 causes the preset clamp mechanism 6 to be operated based on the result of detection by the first sensor mechanism 5 so as to fix the wafer cassette of the identified type. That is, the cassette for wafers with a diameter of 200 mm is fixed by the clamps 25 and the cassette for wafers with a diameter of 300 mm is fixed by the clamp 26.

The first information pad 11 detects whether the cassette is a small cassette or a large cassette and the second information pad 12 detects whether the cassette is an open-type cassette or an integral-type cassette after or concurrent with the detection operation by the first sensor mechanism 5.

After the above confirmation process is performed, the load port apparatus starts the step of removing a wafer from the cassette and transferring the same to a preset position. First, the second sensor mechanism 14 detects the height position of the wafer in the wafer cassette. The two arm portions 17 of the second sensor mechanism 14 have sensors used to detect the height position of the wafer. The distance between the two arm portions 17 is adjusted according to the size of the wafer by the second control mechanism 18 based on the result of detection by the first sensor mechanism. Since the arm portions 17 are inserted into the cassette to detect the wafer, the distance between the two arm portions 17 must be adjusted according to the size of the wafer. When a cassette for wafers with a diameter of 200 mm is placed on the placement table, the distance between the two arm portions 17 is set to preset width "a" shown in FIG. 7. Further, when a cassette for wafers with a diameter of 300 mm is placed, the distance between the two arm portions 17 is set to preset width "b" shown in FIG. 7. After the distance between the two arm portions is adjusted, the two arm portions are simultaneously moved in the upward or downward direction in the cassette so as to detect the height position in which the wafer is received.

If the second sensor mechanism 14 detects the position of each wafer in the wafer cassette, the wafer removal process is started. As the second sensor mechanism 14, a transparent type fiber sensor can be used.

Figure 8:
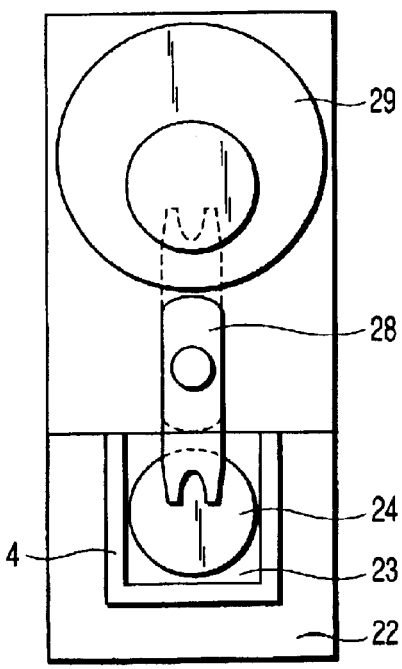
FIG. 8 is a schematic plan view of the load port according to the embodiment of the present invention.

As shown in FIG. 8, the wafer 24 removal from the cassette is transferred onto a sub-chuck 29 by means of a transfer arm (pincette) 28 and placed thereon.

As a second embodiment of the present invention, a load port having no cover is provided. In the second embodiment, it is possible to use the configuration containing a placement table which is similar to the placement table 4 of the first embodiment.

As a third embodiment of the present invention, a load port of a configuration having an opening portion 3 on one side surface of the main body 2 and a three-sided up-down-type cover mechanism 7 which opens/closes the opening portion is provided. The up-down-type cover mechanism 7 described in the third embodiment can be provided with a weight counterbalance mechanism and damper which are the same as the weight counterbalance mechanism 8 and damper 21 described in the first embodiment.

As a fourth embodiment of the present invention, a load port having a wafer cassette placement table 4 arranged on the exterior of one side surface of the main body 2 is provided. Also, in the fourth embodiment, the placement table 4, up-down-type cover mechanism 7, weight counterbalance mechanism 8 and damper 21 described in the first embodiment can be provided.

What is claimed is:

1. A load port configured to selectively receive plural types of cassettes each configured to have substrates configured to be processed accommodated therein, comprising:
   a main body;
   an opening portion formed in one side surface of said main body, said opening portion configured to open in three surfaces including a front surface and right and left side surfaces thereof;
   a placement table provided in said opening portion and configured to receive the cassette thereon;
   a first sensor mechanism provided on said placement table and configured to identify the type of the cassette placed on said placement table;
   plural types of clamp mechanisms provided on said placement table, the clamp mechanism of each type among said clamp mechanisms configured to clamp the cassette of the identified type according to a result of identification by said first sensor mechanism; and
   an up-down-type cover mechanism configured to cover said opening portion of said main body, said cover mechanism configured to be vertically moved to open and close the three surfaces of said opening portion,
   wherein said first sensor mechanism is configured to output cassette identification information and said clamp mechanism comprises a first control mechanism configured to automatically hold the cassette of the identified type and to release the holding operation based on the cassette identification information.

2. A load port configured to selectively receive plural types of cassettes each configured to have substrates configured to be processed accommodated therein, comprising:
   a main body;
   an opening portion formed in one side surface of said main body, said opening portion configured to open in three surfaces including a front surface and right and left side surfaces thereof;
   a placement table provided in said opening portion and configured to receive the cassette thereon;

a first sensor mechanism provided on said placement table and configured to identify the type of the cassette placed on said placement table;

plural types of clamp mechanisms provided on said placement table, the clamp mechanism of each type among said clamp mechanisms configured to clamp the cassette of the identified type according to a result of identification by said first sensor mechanism;

an up-down-type cover mechanism configured to cover said opening portion of said main body, said cover mechanism configured to be vertically moved to open and close the three surfaces of said opening portion; and a second sensor mechanism configured to detect a height position of a wafer in the cassette, wherein said second sensor mechanism comprises two arm portions having sensors configured to detect the height position of the wafer in the cassette, and a second control mechanism configured to adjust a distance between the arm portions, based on the type of cassette determined by the cassette type identification information from said first sensor mechanism.

3. A load port configured to selectively receive plural types of cassettes each having substrates configured to be processed accommodated therein, comprising:

a main body;

an opening portion formed in said main body;

a placement table provided in said opening portion and configured to receive the cassette thereon;

a first sensor mechanism provided on said placement table and configured to identify the type of the cassette placed on said placement table; and a clamp mechanism provided on said placement table, the clamp mechanism configured to clamp the cassette of the identified type according to a result of identification by said first sensor mechanism, wherein said first sensor mechanism is configured to output cassette identification information and said clamp mechanism comprises a first control mechanism configured to automatically hold the cassette of the identified type and to release the holding operation based on the cassette identification information.

4. A load port configured to selectively receive plural types of cassettes each having substrates configured to be processed accommodated therein, comprising;

a main body;

an opening portion formed in said main body;

a placement table provided in said opening portion and configured to receive the cassette thereon;

a first sensor mechanism provided on said placement table and configured to identify the type of the cassette placed on said placement table;

a clamp mechanism provided on said placement table, the clamp mechanism configured to clamp the cassette of the identified type according to the result of identification by said first sensor mechanism; and a second sensor mechanism configured to detect a height position of a wafer in the cassette, wherein said second sensor mechanism comprises two arm portions having sensors configured to detect the height position of the wafer in the cassette, and a second control mechanism configured to adjust a distance between the arm portions based on the type of cassette determined by the cassette type identification information from said first sensor mechanism.

* * * * *